United States Patent [19]

Sonntag et al.

[11] Patent Number: 5,641,086
[45] Date of Patent: Jun. 24, 1997

[54] ENCLOSURE FOR INSTALLATION, INSULATION AND ENCAPSULATION OF ELECTRIC, ELECTRONIC AND PNEUMATIC INSTRUMENTS AND DEVICES

[75] Inventors: John-Erik Sonntag, Tammisaari; Jukka Lehtiö, Salo, both of Finland

[73] Assignee: Fibox Oy Ab, Finland

[21] Appl. No.: 534,076

[22] Filed: Sep. 26, 1995

[30] Foreign Application Priority Data

Nov. 3, 1994 [FI] Finland .................. 945189

[51] Int. Cl.⁶ .................................... B65D 43/14
[52] U.S. Cl. ................. 220/342; 220/334; 16/232; 16/250; 16/DIG. 13
[58] Field of Search ................. 220/334, 342, 220/4.22; 16/250, 232, DIG. 13

[56] References Cited

U.S. PATENT DOCUMENTS

| | | | |
|---|---|---|---|
| 3,204,288 | 9/1965 | Adams | 220/342 X |
| 3,592,354 | 7/1971 | Neilsen | 16/DIG. 13 X |
| 4,731,903 | 3/1988 | Kennedy et al. | 16/DIG. 13 X |
| 4,892,189 | 1/1990 | Kunimune et al. | 220/342 X |
| 4,985,962 | 1/1991 | Weber | 16/232 |
| 5,316,168 | 5/1994 | Finch et al. | 220/334 X |
| 5,357,565 | 10/1994 | Butler, III et al. | 16/250 X |
| 5,381,920 | 1/1995 | Lin | 220/342 |
| 5,513,909 | 5/1996 | Teich | 16/DIG. 13 X |

FOREIGN PATENT DOCUMENTS 841312  10/1985  Finland .

*Primary Examiner*—Stephen K. Cronin
*Attorney, Agent, or Firm*—Merchant, Gould, Smith, Edell, Welter & Schmidt, P.A.

[57] ABSTRACT

An enclosure for electric, electronic and pneumatic instruments and devices, the enclosure comprising a box, a cover and hinge means (20) for mounting the cover to the fasteners (3) of the box, which fasteners comprise a support (5) parallel with the wall. The hinge means (20) comprise bearing apertures (11) for hinge pins of the cover and turnable handles (10) for opening and closing the bearing apertures. For the purpose that it would not be possible to open the enclosure without permission from the hinge side without opening the cover at first, the hinge means (20) comprise a body (12), which covers substantially the fastener (3), and an elastic locking tongue (14), which is situated below the fastener support (5) parallel with the wall. The handles (10) of the hinge means (20) comprise a groove (16) remaining inside the cover (19) when the cover is closed, but enables an access to the elastic locking tongue (14) for pressing it downwards when the cover is in the open position so that the hinge means can be detached from the fasteners (3).

9 Claims, 3 Drawing Sheets

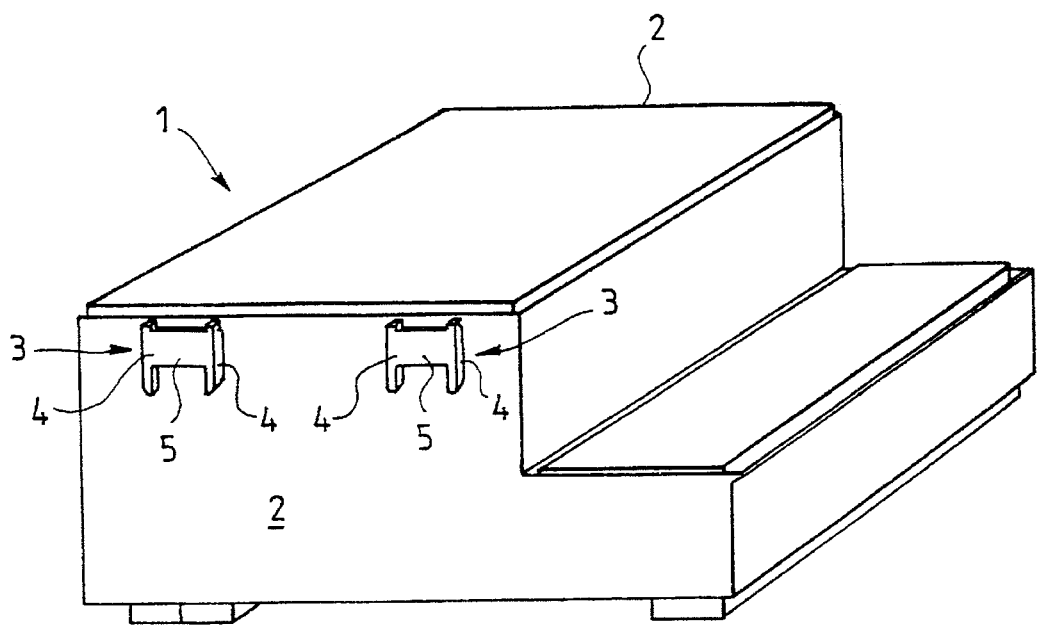
FIG. 1
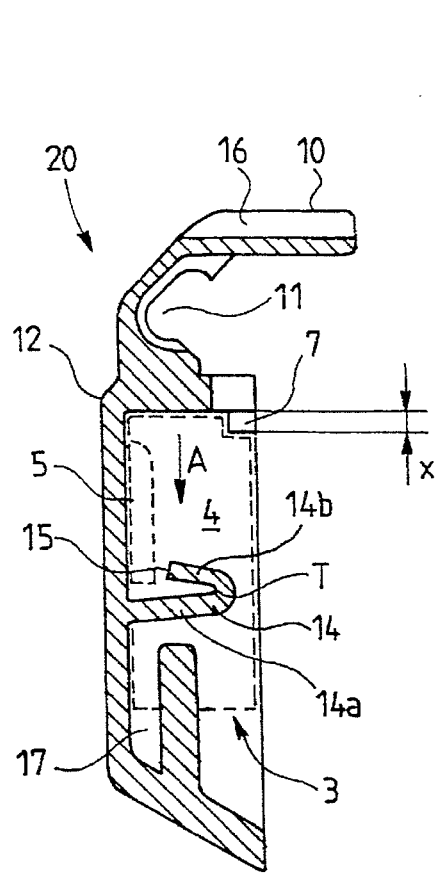
FIG. 10
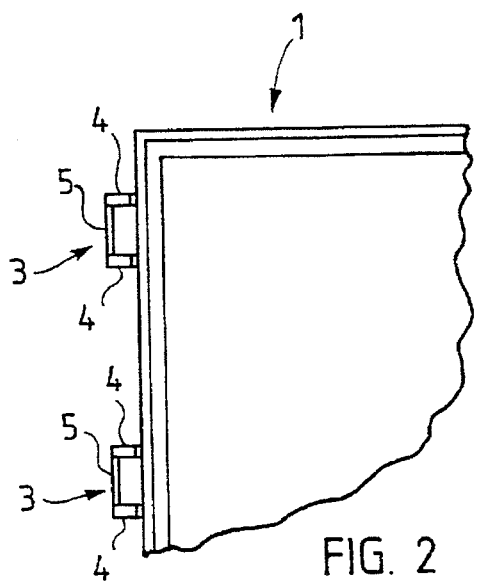
FIG. 2
FIG. 3

ENCLOSURE FOR INSTALLATION, INSULATION AND ENCAPSULATION OF ELECTRIC, ELECTRONIC AND PNEUMATIC INSTRUMENTS AND DEVICES

BACKGROUND OF THE INVENTION

The invention relates to an enclosure for installation, insulation and encapsulation of electric, electronic and pneumatic instruments and devices, the enclosure comprising a box and a cover mounted on the box, whereby at least one side wall of the box is provided with two fasteners comprising supports projecting from the box wall and, for joining the supports of each fastener, a support parallel with the wall, and the cover is provided with hinge pins mounted to the fasteners by hinge means, which comprise bearing apertures for the hinge pins and turnable handles for opening and closing the bearing apertures, the hinge means being essentially prevented from moving in the vertical direction with respect to the fastener when the cover is closed.

A known enclosure introduces a hinge structure, which cannot be opened without tools and the cover of which can be mounted on the box of the enclosure without tools. Using tools, the hinge means can be opened, even if the cover is closed and locked, due to which it is possible to reach the content of the enclosure from the hinge side. This has been considered to be a drawback in certain applications. It has also been found out that the enclosure cannot be mounted on the box as easily as would be desirable: for mounting, the handle parts have to be pressed strongly with both hands in order to engage the hinge means with the fasteners. In addition to strong manual power, the pressing also requires skill and simultaneous fitting for engaging the locking means with the fasteners.

SUMMARY OF THE INVENTION

The object of the present invention is to introduce a novel enclosure, which eliminates said drawbacks. To accomplish this, the present invention provides an enclosure of the afore-mentioned type, wherein the hinge means comprise a body, which substantially covers the fastener to enclose it inside the wall of the box and the body, and an elastic locking tongue supported on the body, which tongue is situated at the lower edge of the fastener support parallel with the wall and comprises a support surface located between the support parallel with the wall and the wall of the box, which support surface prevents, by leaning on the inner surface of the support parallel with the wall, the hinge means from being detached from the fastener, the handles of the hinge means comprise a groove and a side of the cover is shaped in such a way that said groove remains protected by the cover when the cover is closed, but enables an access to the elastic locking tongue when the cover is in the open position, for pressing the tongue downwards, so that the support surface of the locking tongue comes below the lower edge of the support parallel with the wall and the hinge means are detachable from the fasteners of the box.

Compared with an enclosure according to the prior art, the most important advantages of the enclosure according to the invention are that it cannot be opened without permission from the hinge side without opening the cover at first, and additionally, that the cover can be mounted on the box very easily merely by hand.

BRIEF DESCRIPTION OF THE DRAWINGS

In the following, the invention will be described in greater detail by means of one preferred embodiment with reference to the attached drawing, in which FIG. 1 shows a perspective view of a box of an enclosure, FIG. 2 illustrates fasteners of the box of FIG. 1 seen from above, FIG. 3 shows a detail of the box of FIG. 1, FIG. 10 shows an enlarged section along line X—X of FIG. 9.

DETAILED DESCRIPTION OF THE PREFERRED EMBODIMENT

Figure 5:
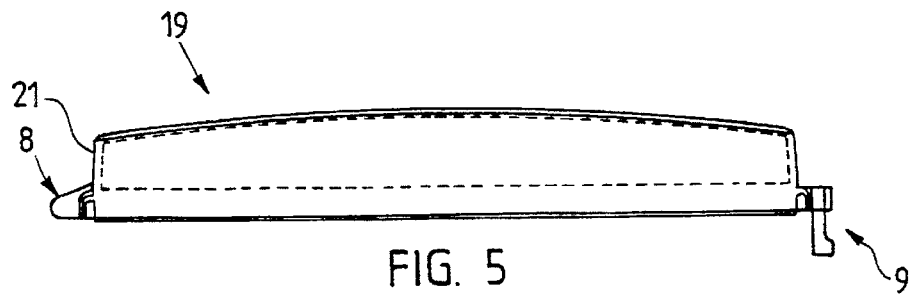
FIG. 5 shows the cover of the enclosure along section line V—V of FIG. 4, FIGS. 6 and 7 show hinge means according to the prior art in open and closed position, i.e. hinge position, respectively.

FIG. 1 shows a perspective view of a box of an enclosure according to the invention. The box, generally indicated by reference numeral 1, comprises two fasteners 3 on each opposite outer wall 2 for mounting a cover of the enclosure (see FIGS. 4 and 5). The fasteners 3, preferably integral with the walls of the box, comprise supports 4 projecting perpendicularly from the outer walls and, for joining these, a support 5 parallel with the wall. The support 5 is at a distance determined by the supports 4 from the outer wall 2. FIG. 2 shows the H-shaped fasteners 3 from above. In FIG. 3, a fastener 3 of the box 1 is shown enlarged from the side. It appears that the supports 4 of the fastener 3 comprise a groove 6 at their upper end. The purpose of the groove 6 is to receive projections 7 of hinge means generally indicated by reference numeral 20 in FIG. 13, which projections prevent, by being locked into the groove, the upper end of the hinge means from moving straight outwards from the wall 2. The depth X of the groove 6 corresponds to the height of the projections 7. The support 5 parallel with the wall is drawn by a broken line in FIG. 10.

Figure 4:
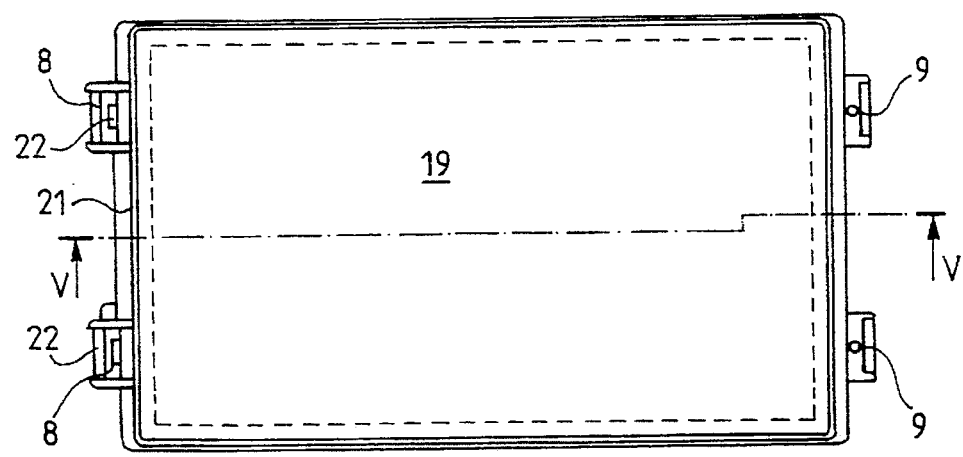
FIG. 4 shows the cover of the enclosure from above.

FIGS. 4 and 5 show the cover 19 of the enclosure. One edge of the cover 19 comprises hinge pins 8, which are mounted to the fasteners 3 of FIG. 1 by the hinge means 20 of FIGS. 8 to 13. The opposite edge of the cover 19 comprises locking means 9, by which the cover is locked to box fasteners not appearing from the figure and being similar to the fasteners 3 appearing from FIG. 1. On account of the above, the handedness of the cover 19 is selectable and also changeable.

Figure 6:
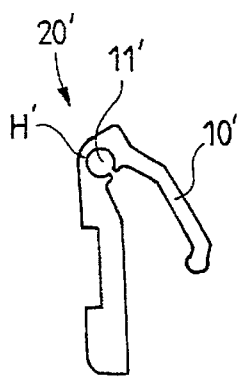
Figure 7:
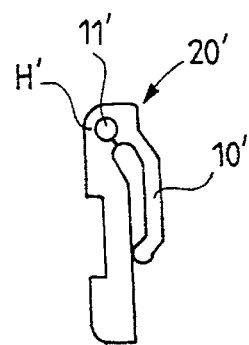
Figure 8:
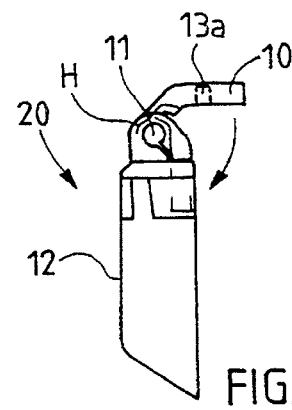
FIG. 8 shows hinge means of the enclosure according to the invention from the side.

The hinge means of plastic shown in the FIGS. 8 to 13 replace known hinge means 20' shown in FIGS. 6 and 7. The only common features are a turnable handle portion 10, 10' and an openable bearing aperture 11, 11' and the fact that the hinge means are locked to similar fasteners. The turnability is implemented by means of a material lightening H at the bearing aperture 11, which lightening acts like a hinge. The bearing aperture 11 can be opened and closed for inserting the hinge pin 8 of the cover 19 into the bearing aperture. From FIG. 8 appears, how the handle portion 10 can be bent into the body 12 of the hinge means in the arrow direction. For this purpose, the hinge means comprise notches 23, as seen from FIG. 12, into which the handle portions 10 are positioned. The handle portion 10 comprises grooves 13a or the like, by means of which it can be locked to corresponding projections 13b or the like on the body 12, see FIG. 13. Thanks to this, the handle portions 10 need not be pressed by hand, contrary to the hinge means of FIGS. 6 and 7, when the hinge means are mounted to the fasteners 3. This fact facilitates substantially the mounting of the cover 19 on the box 1.

Figure 12:
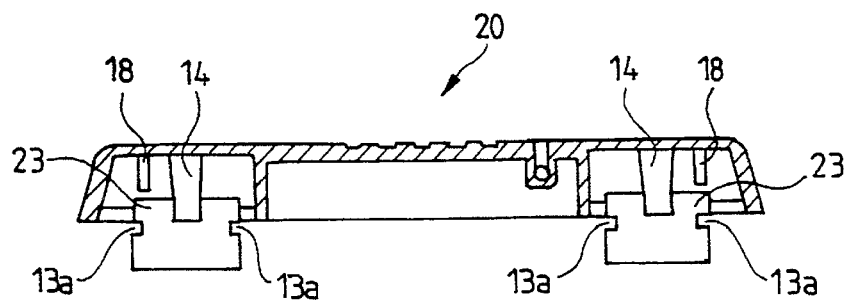
FIG. 12 shows a section along line XII—XII of FIG. 11

The hinge means of FIGS. 8 to 13 are mounted to the fasteners 3 of the box simply by pressing obliquely from above downwards, whereby they snap in their place by means of an elastic locking tongue 14 of the hinge means (see FIGS. 10 and 12). When in place, the hinge means cover the fasteners 3 of the box. When pressed, both a base part 14a and a tip part 14b of the locking tongue 14 yield downwards, and accordingly, the tip part 14b yields towards the base part 14a and the locking tongue 14 is positioned, with the hinge means in place, below and behind the fastener support 5 parallel with the wall, like in FIG. 10. FIG. 10 shows the fastener 3 drawn by a broken line. From the figure is understood that a free end 15 of the locking tongue 14 constitutes a support surface preventing the hinge means from moving from the outer wall of the box outwards and from being detached from the fastener. With the hinge means 20 mounted on the box 1, the handles 10 are bent to the locking position shown by a broken line in FIG. 8.

Figure 9:
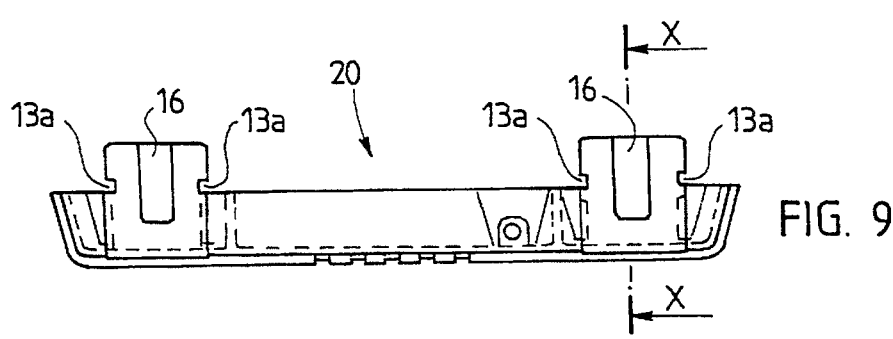
FIG. 9 shows the hinge means of the enclosure according to the invention from above.
Figure 11:
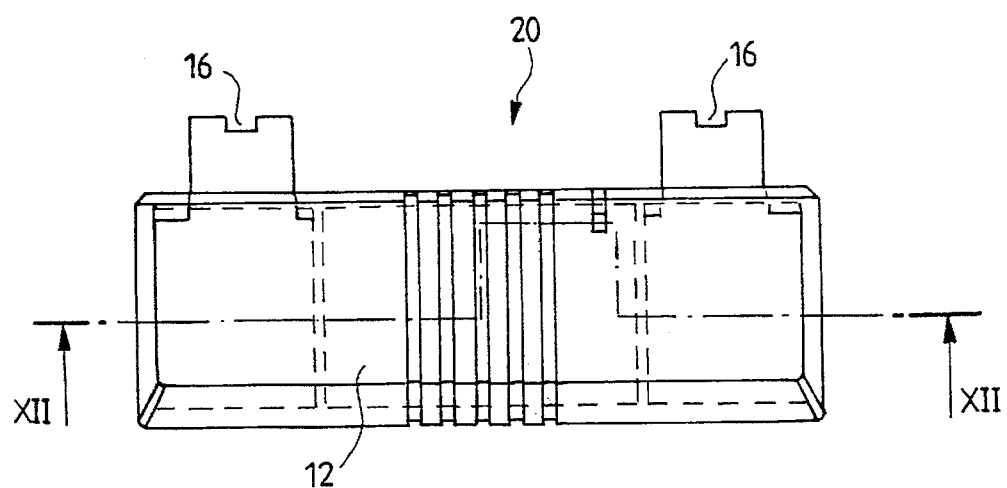
FIG. 11 shows the hinge means from behind, i.e. seen from outside.
Figure 13:
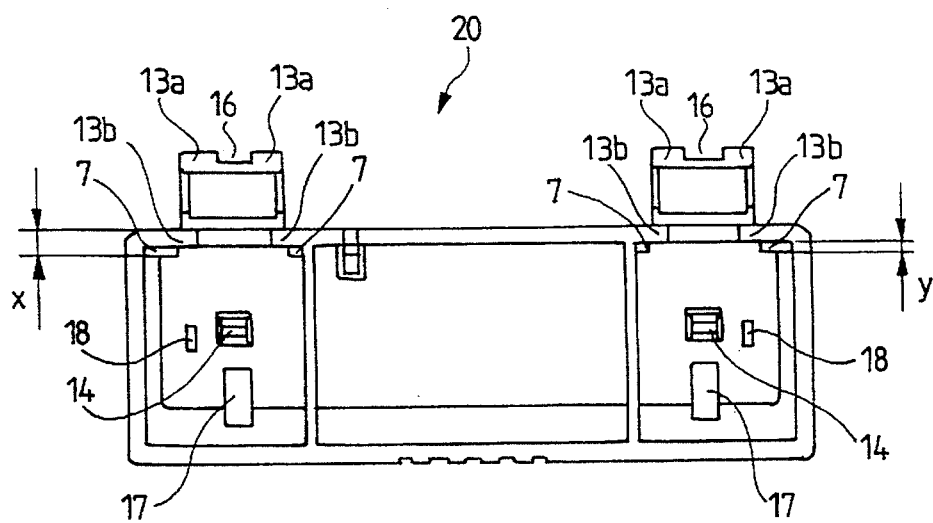
FIG. 13 shows the hinge means seen from inside.

From FIGS. 9, 11 and 13 is seen that the upper surface of the handles 10 of the hinge means comprises a groove 16. The locking tongue 14 can be reached through the groove 16 by means of a small screwdriver or the like, when the cover is opened, cf. FIG. 10. The groove 16 is meant expressly for this purpose. The edge of a side 21 of the cover 19 is shaped so as to cover both the box 1 and the groove 16 when the cover is closed, whereby the locking tongue 14 cannot be reached. For this purpose, the lower edge of the cover is provided with projections 22 covering the grooves 16, see FIG. 4. Alternatively, a projection can be situated on the wall 21 of the cover at a distance from the lower cover edge. When the hinge means 20 shall be removed from the fasteners 3 of the box 1, the cover 19 is opened at first, upon which the grooves 16 of the handles 10 come into sight and the elastic locking tongue 14 is pressed by the screwdriver through said grooves in the direction of arrow A so much that the free end 15 of the locking tongue is positioned below the lower edge of the support 5 parallel with the wall. With the locking tongue 14 in this position, the hinge means can be moved to the left and detached from the fastener 3 by lifting. Accordingly, detaching the hinge means 20 from the fasteners 3 requires that the cover 9 has been opened and the locking tongue 14 has been pressed sufficiently downwards.

A stopper 17 in FIG. 10 also prevents the locking tongue 14 from bending so much that it could break.

In FIGS. 11 to 13, the hinge means 20 are seen from behind, as a cross-sectional view and from inside. Reference numeral 18 indicates pins, which are positioned immediately below the lower edges of the supports 5 of the box fasteners 3. The pins 18 prevent the hinge means 20 from moving upwards when they are in place and the cover 19 is locked. Accordingly, the locking tongue 14 needs not prevent the hinge means 20 from moving upwards, but said strong pins 18 exist for this purpose. The pins 18 are not necessary, but they are to be recommended when the enclosure is supposed to be absolutely tight and to have a strong structure.

The invention has been described above by means of one preferred embodiment, and it is pointed out therefore that the invention may differ in many ways within the scope of the attached claims. Accordingly, the shape of the locking tongue 14 may vary from the described one. It is also clear to one skilled in the art that the side 21 of the cover may be formed alternatively in such a way that it is positioned so close to the bearing apertures 11 that the grooves 16 of the hinge means 20 will be covered. The preventing means 18 for mounting the hinge means in an accurately determined place may differ from the above, as far as their form and location are concerned, or even be lacking. Quick-lock means of the handle 10 of the hinge means may be formed in such a way that the body of the hinge means comprises grooves, while the handle comprises projections communicating with the grooves. The hinge means are not necessarily integral, even if it is to be recommended. Though it has been stated above that the hinge means cover both fasteners, which is very recommendable for a firm structure, it is possible in principle to provide a sufficiently secure operation by a solution in which the hinge means cover one fastener only. Naturally, there may be more than two fasteners on one side wall of the box, but it is of no use, because two fasteners are enough for providing a safe hinging and locking.

We claim:

1. An enclosure for installation, insulation and encapsulation of electric, electronic and pneumatic instruments and devices, the enclosure comprising:

a box having a sidewall provided with at least one fastener, each of said at least one fastener comprising supports projecting from the sidewall and a parallel support parallel to the sidewall for joining the supports of the fastener;

a cover mounted on the box, the cover having a cover side, and being provided with at least one hinge pin, each of said at least one hinge pin attachable to a corresponding one of said at least one fastener; and at least one hinge means, mountable to the box, each of said at least one hinge means for attaching the corresponding hinge pin to the corresponding fastener, the hinge means comprising a turnable handle for opening and closing a bearing aperture, the bearing aperture receiving the hinge pin, a body substantially covering the fastener so as to enclose the fastener between the sidewall of the box and the body, and an elastic locking tongue supported on the body proximate a lower edge of the parallel support, the locking tongue comprising a support surface positionable between the parallel support and the sidewall so as to engage an inner surface of the parallel support and prevent the hinge means from detaching from the fastener, the turnable handle comprising a groove protected by the cover side when the cover is in the closed position and accessible when the cover is in an open position, so as to allow depression of the tongue below the lower edge of the parallel support and disengagement of the support surface and the inner surface, wherein the hinge means is essentially prevented from moving in a vertical direction relative to the fastener when mounted to the box and the cover is in a closed position.

2. An enclosure according to claim 1, wherein the locking tongue comprises a hooked element, a free end of the hooked element forming said support surface.

3. An enclosure according to claim 1, further comprising a stopper provided below the locking tongue, the stopper restricting a depression distance of the locking tongue so as to prevent the locking tongue from breaking.

4. An enclosure according to claim 1, wherein the hinge means comprises pin-shaped preventing means for preventing the cover from being lifted, the preventing means being positioned immediately below the lower edge of the parallel support.

5. An enclosure according to claim 1, wherein the hinge means is made of an elastic material and has a reduced thickness at the bearing aperture (11) so that, with the hinge means removed from the box, the handle is bendable from the hinge position, when it is inside the body of the hinge means, to the open position, when the handle is outside the body of the hinge means.

6. An enclosure according to claim 5, wherein the handle comprises quick-lock means for prestressed locking in the hinge position inside the body of the hinge means.

7. An enclosure according to claim 6, wherein the quick-lock means comprises grooves in communication with projections on the body of the hinge means where the handle is in the hinge position.

8. An enclosure according to claim 7, wherein the body of the hinge means integrally comprises said locking tongue as a unitary body and substantially covers the fastener.

9. An enclosure according to claim 5, wherein the hinge means is formed from plastic.

* * * * *